(12) United States Patent
Hirose et al.

(10) Patent No.: US 6,614,070 B1
(45) Date of Patent: Sep. 2, 2003

(54) SEMICONDUCTOR NON-VOLATILE MEMORY DEVICE HAVING A NAND CELL STRUCTURE

(75) Inventors: Ryan T. Hirose, Colorado Springs, CO (US); Loren T. Lancaster, Colorado Springs, CO (US)

(73) Assignee: Cypress Semiconductor Corporation, San Jose, CA (US)

( * ) Notice: Subject to any disclaimer, the term of this patent is extended or adjusted under 35 U.S.C. 154(b) by 65 days.

(21) Appl. No.: 09/613,874

(22) Filed: Jul. 10, 2000

Related U.S. Application Data

(63) Continuation of application No. 09/051,700, filed on Apr. 16, 1998, now Pat. No. 6,163,048.

(51) Int. Cl.[7] .................... H01L 29/788; H01L 29/792; G11C 11/34
(52) U.S. Cl. .................... 257/316; 257/322; 257/324; 257/326; 365/184
(58) Field of Search .................... 257/315, 316, 257/322, 324, 326; 365/104, 184, 185.01, 185.05, 185.11, 185.13, 185.17, 185.18, 185.24, 185.25, 185.26, 185.27, 185.28, 185.29, 189.01, 189.09, 222

(56) References Cited

U.S. PATENT DOCUMENTS

| | | | | |
|---|---|---|---|---|
| 5,345,418 A | * | 9/1994 | Challa | 365/185.17 |
| 5,349,222 A | * | 9/1994 | Shimoji | 257/326 |
| 5,589,700 A | * | 12/1996 | Nakao | 257/325 |
| RE35,838 E | * | 7/1998 | Momodomi et al. | 365/185.17 |
| 5,978,265 A | * | 11/1999 | Kirisawa | 365/185.17 |

FOREIGN PATENT DOCUMENTS

JP 62-155568 * 7/1987 ............ 365/185.17

* cited by examiner

*Primary Examiner*—Steven Loke
(74) *Attorney, Agent, or Firm*—Bradley T Sako

(57) ABSTRACT

A NAND stack array (95') is placed within a well formed on a semiconductor substrate and includes a series array of memory cell transistors (10) whose threshold voltages can be electrically altered over a range of depletion values. When a cell within a certain NAND stack is selected for a read operation, a peripheral circuit drives selected gate word line to the well potential and drives the word lines of the other gates within the selected NAND stack to a potential at least equal in magnitude to the magnitude of the a reference voltage plus the threshold voltage of a memory cell in the programmed state.

13 Claims, 10 Drawing Sheets

|  | READ BIAS | ERASE BIAS | PROGRAM BIAS (METHOD 1) | PROGRAM BIAS (METHOD 2) |
|---|---|---|---|---|
| SELECTED WL | 0 v | 0 v | 15.5 - 20 v | 15.5 - 20 v |
| UNSELECTED WL | 4.5 v | 0 v | 10 v | 10 v |
| SSL | 4.5 v | F (FLOAT) | Vcc | 10 v |
| GSL | 4.5 v | F | 0 v | 0 v |
| CSL | 0 v | F | 0 v | 0 v |
| BL OF PROGRAM CELL | 1.8 v | F | 0 v | 0 v |
| BL OF ERASE CELL | 0.7 v | F | Vcc | 8 v |
| BULK | 0 v | 21 v | 0 v | 0 v |

|  | READ BIAS | ERASE BIAS | PROGRAM BIAS |
|---|---|---|---|
| SELECTED WL | Vs Ground | Vnege (e.g. -12 v) | Vcc |
| UNSELECTED WL | Vg, on (e.g. Vcc) | Vcc | Vnegp (e.g. -14 v) |
| SSL (OPTIONAL) | Vcc (e.g. 3.3) | Vcc | Vcc |
| GSL | Vcc | Vcc | Vnegp |
| CSL | Voff (e.g. 1.8 v) | Vcc | 0 |
| BL OF PROGRAM CELL | Vcc | Vcc | Vnegp |
| BL OF ERASE CELL | Voff < V < Vcc | Vcc | Vinh |
| BULK | Vs | Vcc | Vnegpw (e.g. -15 v) |
FIG. 9
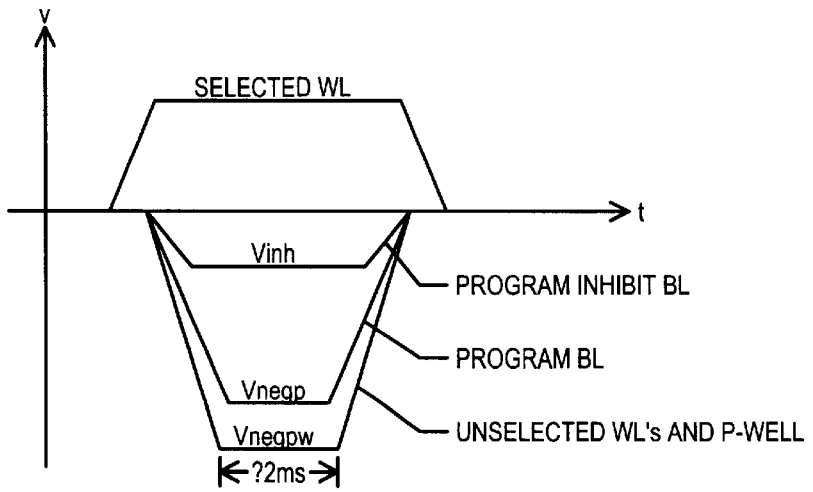
FIG. 10
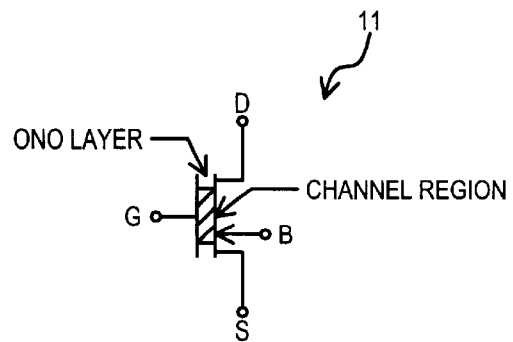
FIG. 11

| | READ BIAS | | ERASE BIAS | | PROGRAM BIAS | |
|---|---|---|---|---|---|---|
| | SONOS | FG | SONOS | FG | SONOS | FG |
| SELECTED WL | Vs=0 v | Vs=0 v | Vnege=-7.0 v | Vnege=-15.0 v | Vcc=3.0 v | Vcc=3.0 v |
| UNSELECTED WL | Vg, on=3.0 v | Vg, on=3.0 v | Vcc=3.0 v | Vcc=3.0 v | Vnegp=-7.0 v | Vnegp=-15.0 v |
| SSL | Vcc=3.0 v | Vcc=3.0 v | Vcc=3.0 v | Vcc=3.0 v | Vcc=3.0 v | Vcc=3.0 v |
| GSL | Vcc=3.0 v | Vcc=3.0 v | Vcc=3.0 v | Vcc=3.0 v | Vnegp=-7.0 v | Vnegp=-15.0 v |
| CSL | Voff=1.8 v | Voff=1.8 v | Vcc=3.0 v | Vcc=3.0 v | Vs=0 v | Vs=0 v |
| BL OF PROGRAM CELL | Vcc=3.0 v | Vcc=3.0 v | Vcc=3.0 v | Vcc=3.0 v | Vnegp=-7.0 v | Vnegp=-15.0 v |
| BL OF ERASE CELL | ?2.0 v | ?2.0 v | Vcc=3.0 v | Vcc=3.0 v | Vinh=-2.0 v | Vinh=-6.0 v |
| BULK | Vs=0 v | Vs=0 v | Vcc=3.0 v | Vcc=3.0 v | Vnegpw=-8.0 v | Vnegpw=-16.0 v |

FIG. 13

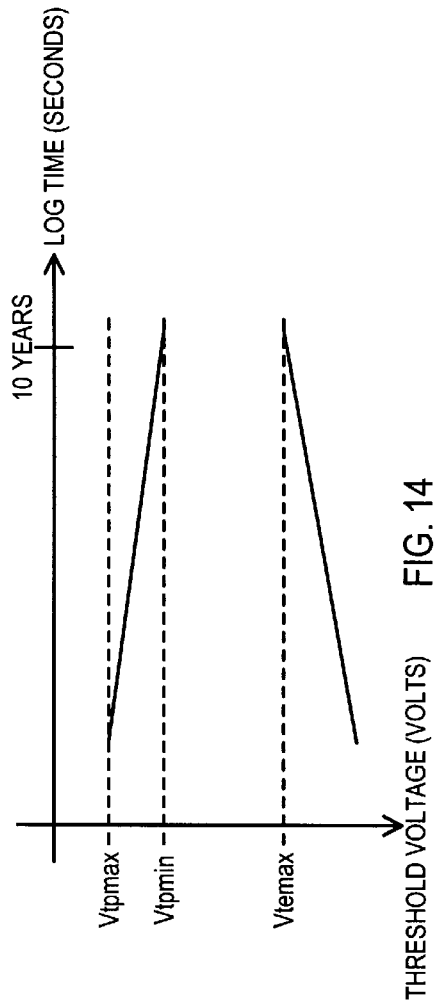

FIG. 14

SEMICONDUCTOR NON-VOLATILE MEMORY DEVICE HAVING A NAND CELL STRUCTURE

The following is a continuation of application Ser. No. 09/051,700 filed on Apr. 16, 1998, now U.S. Pat. No. 6,163,048.

BACKGROUND OF THE INVENTION

1. Field of the Invention

The present invention relates to improvements in semiconductor memories and, more particularly, to improvements in electrically erasable, electrically programmable read-only memories used for large capacity data storage.

2. Description of the Related Art

The demand for portable and hand held devices which require large amounts of data storage has grown substantially within recent years and is expected to continue to grow well into the next decade. Products such as digital cameras, cellular telephones, personal organizers, voice recording devices and palm top personal computers as well as a host of specialized remote data collection tools are available today and several new products are in development. In nearly all of these products data is stored on solid state electronic media rather than on a hard disk drive, due to the requirements of higher performance, lower energy consumption and superior ruggedness. However, the cost of a given amount of solid state storage media has proven to greatly exceed that of hard disk drive solutions, making it difficult to build attractively priced products which contain enough solid state memory to adequately meet the product requirements.

Recently, a "NAND" type non-volatile memory cell structure has reemerged as a proposed way to reduce manufacturing costs over conventional solid state storage. Higher storage capacity and lower costs are achieved by utilizing a smaller memory cell composed of a single memory transistor which shares each of its nodes with adjacent memory cells. Several such cells are grouped together in a "NAND stack", with their channels in series, along with means to connect the stack ends to a bit line and a reference line. In the past the non-volatile memory transistor used a MNOS non-volatile element, but more recently, floating gate approaches have dominated. In either case the small cell size is the key element which enable higher densities and lower costs.

However, floating gate NAND cells have not been able to realize expected cost reductions due to inherent limitations. Internal write voltages of floating gate NAND memories are typically five to seven times the normal CMOS product power supply limits. Cells sizes are difficult to scale due to the stacked polysilicon floating gate geometry making manufacturing increasingly difficult. Threshold voltages are difficult to control, causing long test times and lower product yields. Each of these factors are intrinsic to the floating gate NAND approach and each significantly affects the product cost.

In the past MNOS (Metal Nitride Oxide Silicon) NAND memory arrays were proposed as a means to realize lower costs. The MNOS structure is conceptually a better approach than the floating gate method, since it is simpler to manufacture, has a naturally tighter threshold voltage distribution, requires minimal test times, and enables much lower write voltages. However, the methods proposed for reading and writing MNOS NAND memories progressively weakens the stored data, destroying it altogether prior to the expected life of the product. This problem is referred to as a "disturb".

Referring now to FIG. 1, current NAND technologies utilize a single transistor floating gate device 10. The drain (D), gate (G), source (S), and bulk (B) contacts, as well as the floating gate (FG) are labeled. Current flows in a channel region between the drain and source when the drain and source are at different potentials, and under direct control of the potential placed on the gate relative to the source and bulk, whose potentials need not be equal. The FG is a non-volatile charge storage node isolated from and between the gate and the channel region. To erase a memory cell, a large negative gate to bulk potential is formed that couples the layer FG to a negative potential, causing holes to be accumulated in the channel region. These holes can tunnel to the FG by the Fowler-Nordheim effect, because of the large electric fields that result from the large gate to bulk potential. Holes on the FG will erase the memory cell to shift the threshold in a negative direction to provide a logic "0" stored state.

To program the memory cell, a large positive gate to bulk potential is formed that couples the FG to a positive potential and inverts the channel region with electrons. As with holes, the electrons can tunnel to the FG by the Fowler-Nordheim effect. The threshold voltage of the memory transistor shifts in the positive direction to provide a logic "1" state.

Conventional NAND technologies are designed such that erased memory cells have depletion thresholds and programmed memory cells have enhancement thresholds. More specifically, the depletion state threshold voltage is achieved when the gate voltage is negative with respect to the source node and the enhancement state threshold voltage is achieved when the gate voltage is positive with respect to the source node. When written, these negative and positive thresholds have a fairly broad distributions, typically in the 1.5–2.0 volt range.

A conventional NAND stack 20 is shown in FIG. 2, where sixteen (16) non-volatile memory cells 10 (MC0–MC15) are placed in series with two n-channel select transistors 11 and 12, transistors 11 being placed at the drain side (MSD) and transistor 12 being placed at the source side (MSS) of the memory transistors 10. Except for memory transistors MC0 and MC15, the drain and source of adjacent memory cells are connected together. The source of memory transistor MC0 is connected to the drain of the next memory cell down, memory transistor MC1. Also, the drain of memory transistor MC0 is connected to the source of memory transistor MSD and the drain of memory transistor MSD is connected to the metal bit line (BL). The drain of memory transistor MC15 is connected to the source of the next memory cell above, memory transistor MC14. Also, the source of memory transistor MC15 is connected to the drain of select transistor MSS and the source of select transistor MSS is connected to the common reference line (CSL), which is typically a diffusion.

It should be noted that the NAND stack unit can be replicated in both the BL direction (column) and orthogonal to the BL direction (row) to form NAND stack arrays of various sizes. NAND stack units in a column connect to a single BL while gates of memory cells within a stack connect to word lines (WL). The gates of the two select transistors connect to select lines (SSL and GSL). The WL's SSL and GSL run orthogonal to the BLs and are typically formed of polysilicon or a multilayer composite, generally including a silicide on polysilicon. The first memory cells MC0's) in NAND stack units along the same row are connected to WL0 and the last memory cells (MC15's) in NAND stack units along the same row are connected to WL15. This is also true for the other memory cells and the select devices in NAND stack units along the same row.

During reading of the selected memory cell, a current path must be maintained from the selected memory cell to the CSL and BL connections of the NAND stack. Each of the fifteen non-selected NAND cells in the selected NAND stack are rendered conductive by applying sufficient gate to source voltage to not only overcome the positive enhancement threshold voltage but also to provide for a high level of conductance. Then with the gate of the selected memory cell and the CSL of the NAND stack set to ground, the state of the selected cell can be determined by sensing current flow through the selected NAND stack. When the selected memory cell has a negative depletion threshold, current will flow through the NAND stack, and when the selected memory cell has a positive enhancement threshold, little or no current will flow through the NAND stack.

Examples of read, erase and program operation bias schemes are shown in FIG. 3, according to conventional NAND approaches. These biases are applied during a time in which the operation achieves the desired result. A complete wave form diagram would show the conditions before and after these biases as well as the time periods; however, only the change affecting bias conditions are shown here. The read biases are typically active for periods of tens to thousands of nanoseconds and the erase and program biases are active for periods of 100 microseconds to seconds. The amount of time depends on the device size and the performance objectives of the product.

Referring now to FIG. 4, during a read operation, the reference line CSL is at the same potential as the bulk of the NAND transistors, or $V_s$=ground. The gates of the memory cells in the path of the selected cell and the two select devices are boosted to 4.5 v, and the gate of the selected memory cell is left at the CSL potential. The 4.5 v potential is used, first, to overcome the positive enhancement program thresholds on unselected memory cells, and, second, to achieve suitable conduction. Achieving the second objective depends on the number of unselected devices within the selected NAND stack which are in the positive enhancement program state, which can be anywhere from zero to fifteen. The condition that requires the most gate voltage is that in which the selected memory cell, say MC1, is erased to a negative threshold and all of the unselected memory cells have a high positive threshold and the BL potential is low, say at 1 volt. In this situation, the erased selected memory cell has 0 volts on its gate WL1 and is sinking current from the BL, and the unselected memory cell at the top of the NAND stack (e.g. MC0) has a program threshold. To maintain sufficient conduction through the unselected memory cell, its gate voltage applied to WL0 must be at least $V_g = V_{tp} + V_s + V_{on}$, where $V_{tp}$ is the enhancement program threshold voltage of MC0, $V_s$ is the source voltage on MC0 and $V_{on}$ is the additional voltage required to achieve sufficient conductivity.

More specifically, when $V_{tp}$ is 2.0 volts, $V_s$ is very near the BL voltage of 1.0 volt and Von should be at least 1.5 volts, so $V_g \leq 4.5$ volts. A Vg potential of 4.5 volts or higher would require internal boosting above $V_{cc}$ when the nominal supply voltage $V_{cc}$ is less than 4.5 volts. This is highly disadvantageous when attempting to optimize device read performance is today's products where $V_{cc}$ is typically 3.3 volts or below. During a read operation, the time and power required to boost fifteen word lines to 4.5 volts and the two select lines can be substantial. Since the word lines and select lines run completely across the NAND structured memory array, the amount of capacitance that must be boosted to 4.5 volts could be on the order of tens and possibly hundreds of picofarads. Even though this is readily done on today's NAND devices, a method for reading that does not include boosting would be extremely beneficial.

It can be seen that during a read operation, the gate to source potential is greatest on MC15, the memory cell closest to the grounded CSL reference line. If the selected cell is in the conductive erased state, current will flow through the NAND stack; however, there will be little voltage loss between the source of MC15 and the reference line CSL since the selection device MSS is biased well on. Further, if the selected device were in the non-conductive program state, then very little or negligible current would flow through the NAND stack, and the gate to source voltage on MC15 would be nearly exactly equal to the gate voltage on WL15. Thus, the gate to source voltage on MC15 is for all practical purposes equals the voltage on WL15 during read operations.

Furthermore, when reading a NAND device, the address pattern will not necessarily follow a preset sequential pattern, but rather might follow a random or frequently favored partial pattern. Therefore, there is no assurance that each of the rows within a NAND stack will be read in sequence, nor is there assurance that they will ever be read. A worst case analysis would include the condition that only the MC0 is read, and that it is always in the enhancement programmed state. Under this configuration, little or negligible current will flow, and the gate to source voltage on MC1 through MC15 will be nearly equal to their word line voltages. Thus, under worst case conditions, the gate to source voltage on MC1 through MC15 is equal to the worst case gate to source voltage described above for MC15 during typical read operations.

Therefore, when the device is set in a data read mode under worst case conditions, a gate to source bias is applied to transistors MC1 through MC15 within a selected NAND stack. The bias is expected to be $V_g \approx V_{tp} + V_s + V_{on}$ applied during each and every read. As shown in FIG. 3 the gate to source voltage applied to a selected word line during a program mode is of the same polarity as the voltage applied to an unselected word line during a read mode. Even though the program mode voltage is much greater than that used during the read mode, continuous reading during the expected like of the part can cumulatively disturb the stored data much as if it were in the program mode. This disturb problem is manageable if the gate to source voltage is much smaller than that used to program the device. However, this requires that the gate to source voltage be as small as possible or that the program voltage be very large. Neither is desirable and ultimately product performance or reliability must be compromised.

The method employed in NAND devices for programming memory cells is one that programs a single WL at a time. Page buffers are first loaded with data one byte at a time until the desired data is present and then the WL is brought to a high level ($V_{pp}$), typically in the 15.5 to 20 volt range. To program a memory cell to a high threshold voltage, 0 volts is transferred to the BL from the data buffer prior to placing Vpp on the selected WL. This creates a high positive gate to channel electric field that causes electrons to tunnel to the FG shifting the threshold voltage positively.

There are two methods primarily used to inhibit the programming of memory cells on the selected word line when using "program inhibit" mode. The first is a method known as "self-boosting". The second is a method using a relatively high inhibit voltage on the bit lines. With the self boosting program inhibit method, unselected WL's are raised to 10 volts and the selected WL is raised to 15 to 20 volts. When these nodes are raised, capacitance between these nodes and the NAND stack channel regions causes the channel potential to rise. Once the NAND stack channel is capacitively coupled above $V_{cc}$ in the self-boosting method, $V_{cc}$ is held on the desired BL and on SSL to cut-off the top select device of the NAND stack. Then the channel potential in the NAND stack continues to rise by the capacitive coupling and all the channel regions are coupled to approximately 8 volts to inhibit the programming on the selected WL. In program inhibit method, 8 volts from a latch in the data buffer is placed on the BL associated with the selected WL. This 8 volts is then transferred through the MSD and memory transistors to the channel regions of all memory cells in the NAND stack containing the selected WL which inhibits programming. While programming or program inhibiting, all voltages are above ground.

With either program mode method, the unselected word line voltage is at ten (10) volts. When the selected transistor is to be programmed, zero volts is supplied by the bit line to the channel regions of the transistors within the NAND stack. Even though the program mode voltage is used far less often than the read mode, the voltage is much higher and a minimal amount of program operating can cumulatively disturb the stored data. Ultimately product performance or reliability must be compromised to accommodate this high voltage.

The method used to erase the memory cells in the NAND stack is a bulk method that erases all memory cells connected to the same bulk connection. The gates of all memory cells are held at 0 volts and the bulk is then taken to 21 volts.

As integrated circuit technology advances to smaller geometries and lower operating voltages, it becomes increasingly difficult to accommodate the large voltages required to program and erase conventional devices. Larger than normal geometries and special device structures are required to switch and route the program voltages, ultimately resulting in high final product costs. It is desirable to reduce program voltages in order to improve costs and reliability. Such reduction are limited, however, by the read disturb problem described before. As program voltages are lowered, read voltages become increasingly disturbing.

Therefore, during read and write operations, NAND cell structures require the application of voltage to memory cell gates within the NAND stack to render them conductive and to provide a clear current path to the selected memory cell within the stack. Currently, the applied gate to source voltage on the cells in the path must be of sufficient magnitude to not only overcome an enhancement threshold voltage in the NAND stack cells but also enough to provide sufficient inversion to achieve acceptable current flows. The combined objectives requires a gate to source voltage greater than that which can be reliably used without creating a disturb problem in read and program modes or without requiring internal voltage boosting in read mode.

Therefore, without further innovation the low cost advantages of the NAND approach cannot be used without significantly limiting the number of operations to minimize the effect of disturbs. Further voltages will remain higher than desired and disturb effects will also complicate floating gate product designs.

SUMMARY OF THE INVENTION

In light of the above, therefore, it is an object of the invention to provide an improved non-volatile semiconductor memory device that provides better data storage reliability compared to prior art devices.

It is another object of the invention to provide an improved non-volatile semiconductor memory device that can be read a substantially higher number of times without loss of data compared to prior art devices.

Another object of the invention is to provide an improved non-volatile semiconductor memory device that can be written a substantially higher number of times without loss of data compared to prior art device.

It is further an object of the invention to provide an improved non-volatile semiconductor memory device that achieve better read performance by eliminating the need to internally boost potentials beyond the supply voltage $V_{cc}$ during a read operation.

It is yet another object of the invention to provide an improved non-volatile semiconductor memory device that provides higher manufacturability by reducing gate voltages during read and write operations.

Yet another object of the invention is to provide an improved non-volatile memory device that realizes smaller chip size by eliminating the transistor between the bit line and the NAND stack.

It is still further another object of the invention to provide an improved non-volatile memory device that can be produced at lower costs by reliably utilizing a dielectric charge storage.

The above and further objects, details and advantages of the invention will become apparent from the detailed description of the preferred embodiments presented hereinafter, when read in conjunction with the accompanying drawings.

According to the present invention, there is provided a NAND stack array on a semiconductor substrate of a first conductivity type, a well area of a second conductivity type in the substrate, parallel bit lines formed over the semiconductor region oriented in a first direction, parallel word lines oriented in a second direction over the semiconductor region beneath the bit lines, reference line segments of a first conductivity type in the surface of the well and oriented the second direction, and rewritable NAND stacks, forming "NAND stack arrays," connected on one end to bit lines and on the opposite end to reference line segments. The NAND stack is placed within the well and includes a series array of memory cell transistors whose threshold voltages can be electrically altered over a range of depletion values. The memory cell transistors include a pair of source and drain regions of a first conductivity type formed in the surface of the semiconductor regions within the well, a control gate, and a charge accumulation layer, such as a layer of silicon nitride or a floating gate, formed to cover the semiconductor area between the source and drain regions. The well area provides junction isolation between the bias applied to the bulk of the memory transistors and the bias applied to other circuitry within the non-volatile semiconductor memory in regions peripheral to the NAND stack array. Peripheral circuits include a driving circuit for biasing the reference line segments to a potential within the range of from the well potential to at least the supply potential $V_{cc}$, such as Voff, during read operations. When a cell within a certain NAND stack is selected for a read operation, a second peripheral circuit drives the selected gate word line to the well potential and driving the word lines of the other gates within the selected NAND stack to a potential included within the range of $V_{off}$ to $V_{cc}$.

BRIEF DESCRIPTION OF THE DRAWINGS

In the detailed description of preferred embodiments of the invention present below, reference is made to the accompanying drawings of which:

FIG. 9 is a table showing example biases applied to the NAND stack during read, erase and program operations according to a preferred embodiment of the invention;

FIG. 10 illustrates the wave forms of main electrical signals appearing in main portions of the NAND stack having the schematic of FIG. 6 during various modes of operation;

FIG. 11 shows a schematic representation of a NAND memory transistor utilizing a silicon nitride dielectric charge accumulation layer;

FIG. 13 shows a table of example biases applied to the NAND stack during read, erase and program operations according to another preferred embodiment of the invention;

FIG. 14 shows a typical plot of threshold voltage as a function of decades of time of NAND memory cells within a NAND stack array according to a preferred embodiment of the present invention;

DETAILED DESCRIPTION OF THE PREFERRED EMBODIMENTS

Figures 3, 5:
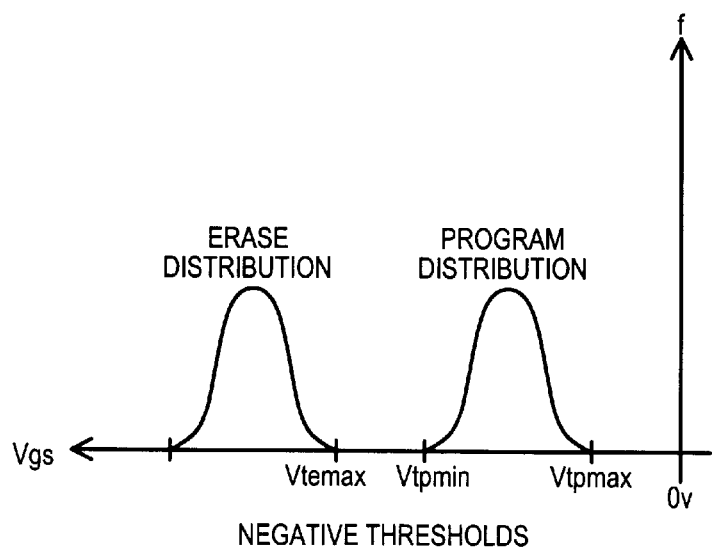
FIG. 3 shows the conventional biases applied to the NAND stack during read, erase and program operations according to the prior art.
FIG. 5 shows a typical plot of threshold voltage distributions of NAND memory cells within a NAND stack array according to a preferred embodiment of the present invention.

According to a preferred embodiment of the invention, a device is provided that shifts all program and erase threshold voltages to negative depletion values. As seen in FIG. 5, program threshold voltage distributions within the new device range from $V_{tpmax}$ to $V_{tpmin}$ and erase threshold voltage distributions range below $V_{temax}$. In all instances, the threshold voltages refers to the gate voltage of a transistor measured relative to the source of that same transistor, in accordance with industry standards. The shape of the program and erase threshold voltage distributions are for illustration purposes, and may differ from the actual shapes of the distribution, which are highly technology dependent. All threshold voltages mentioned above satisfy the following condition of 0 volts$>V_{tpmax}>V_{tpmin}>V_{temax}$. Typical values for these values may be $V_{tpmax}$=-0.5 v, $V_{tpmin}$=-1.5 v, and $V_{temax}$=-2.0 v.

Figure 6:
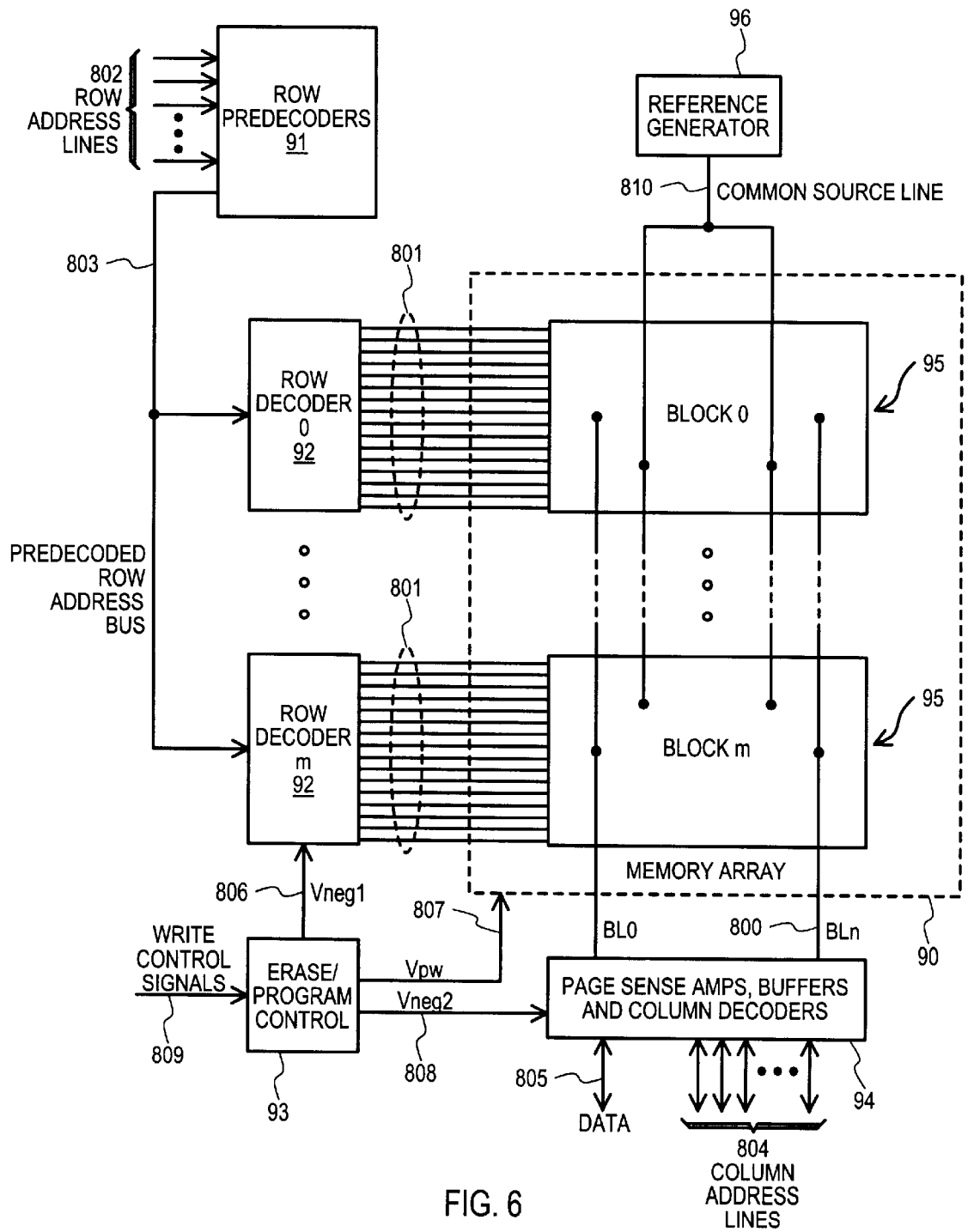
FIG. 6 schematically shows the overall circuit arrangement of the NAND stack cell memory circuit according to a preferred embodiment of the present invention.

Referring additionally now to FIG. 6, a non-volatile memory device according to a preferred embodiment of the invention has a memory array 90 which includes at least two blocks 95, each block 95 being at least one, and preferably more than one NAND stack units in height. Various embodiments of the NAND stacks within the blocks 95 in FIG. 6 are described in detail below. Associated with each block 95 are the row decoders 92 that drive line 801 across the width of the blocks 95, including word lines, WL, global select line, GSL, and an optional stack select lines, SSL. The use of these lines 801 within block 95 are shown in greater detail below. The blocks 95 are linked together by the bit lines 800 that also go to the page sense amplifiers, buffers and column decoders 94. Further, blocks 95 are linked together in common by common source line 810 which forms a common reference node, hereinafter called CSL, whose voltage is generated and controlled by reference generator 96.

Reference generator 96 is required since the voltage on the CSL is not equal to ground potential during read modes as will be described in detail later. Predecoded row address selection information is supplied to row decoders 92 by the row predecoder 91 by way of the predecoded row address bus 803. Row address lines 802 supply row input address information to row predecoders 91 and likewise column address lines 804 provide column input address information to column decoders included in 94. An erase/program control unit 93 is included which is controlled by write control lines 809 to supply $V_{neg1}$ 806 to the row decoders 92, $V_{neg2}$ 808 to the page sense amps, buffers and column decoders unit 94, and $V_{pw}$ 807 to the memory array 90. Data input and output is performed by way of data line 805.

Figure 1:
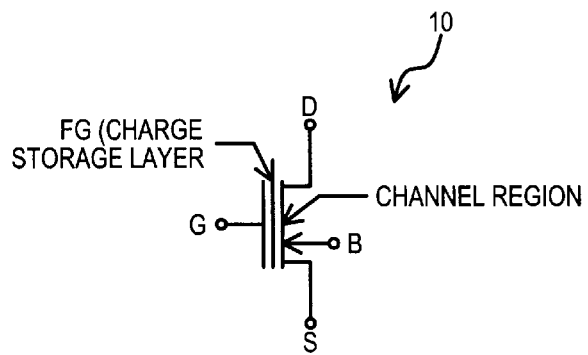
FIG. 1 shows a schematic representation of a floating gate NAND memory transistor according to the prior art.
Figure 2:
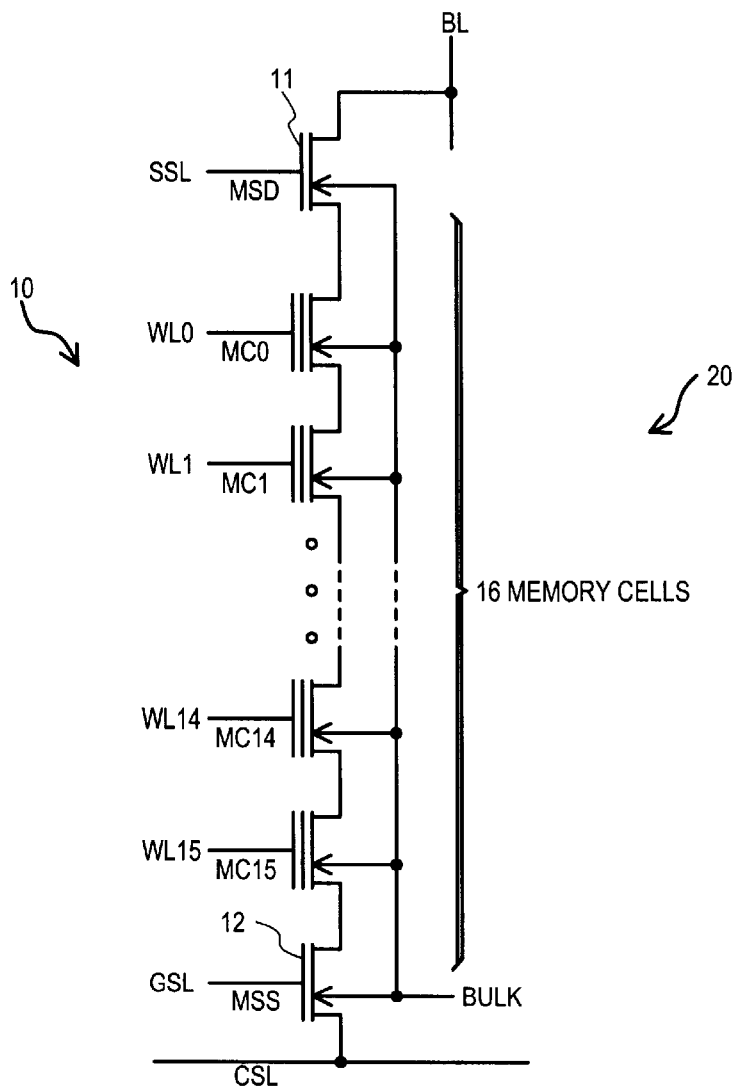
FIG. 2 illustrates the internal arrangement of a floating gate NAND memory stack according to the prior art.
Figure 7:
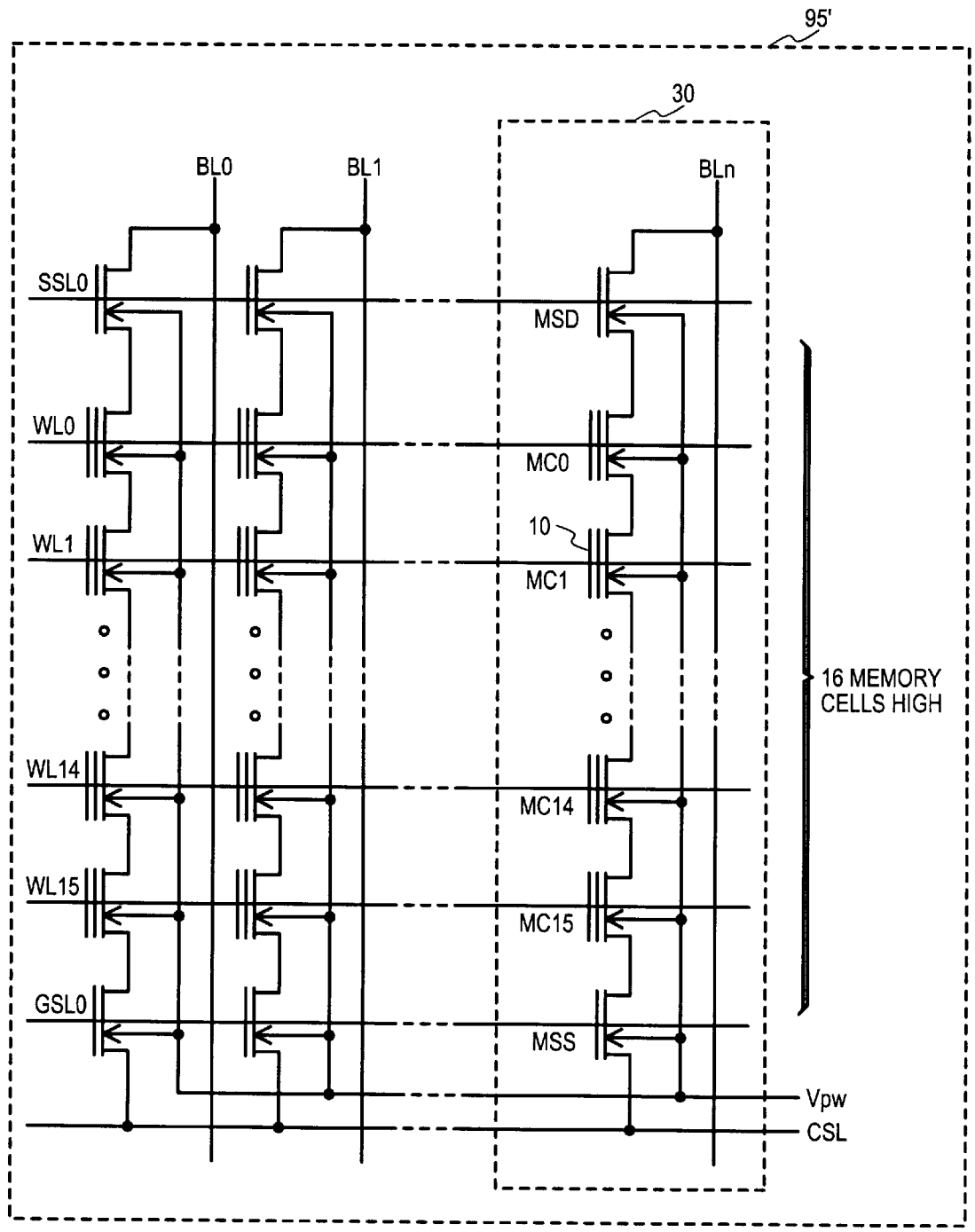
FIG. 7 schematically shows the internal circuit arrangement of a NAND configured non-volatile memory according to a preferred embodiment of the invention using a floating gate charge accumulation layer.
Figure 8:
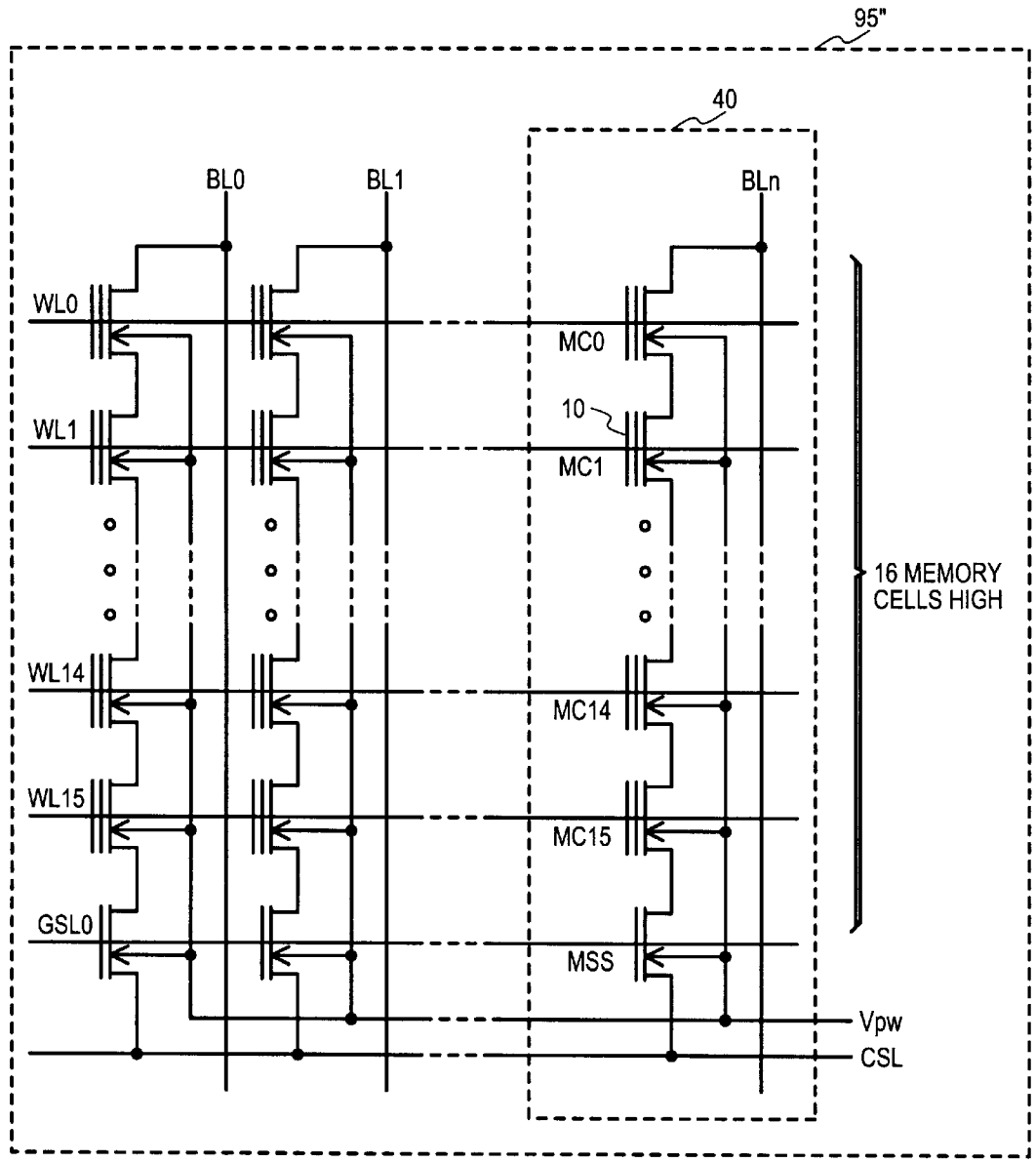
FIG. 8 schematically shows the an internal circuit arrangement of a NAND configured non-volatile memory according to another preferred embodiment of the invention using a floating gate charge accumulation layer.

FIGS. 7 and 8 show two NAND stacks embodiments 95' and 95", respectively, which are be used in the device shown in FIG. 6. As shown in FIG. 7, block 95' includes (n+1) copies of the NAND stack 30 according to a first embodiment of the invention. Each NAND stack 30 is connected at the top to one of (n+1) bit lines, BL0, BL1, through BLn and connected on the bottom to the common source line, CSL. Further, the entire block 95' resides within a common well connected to $V_{pw}$. The NAND stack 30 includes a number of non-volatile transistors 10 as described above for FIG. 1. Typically the number of transistors 10 equals a power of two when used to store binary data, and in FIGS. 7 sixteen transistors, labeled MC0, MC1, through MC15, are shown as an example embodiment. The gates of transistors MC0, MC1, through MC15 are connected in common with gates of adjacent NAND stacks within block 95' by way of word lines WL0, WL1 through WL15, respectively. The NAND stack 30 also includes selection transistors MSD and MSS whose gates are connected in common with adjacent NAND stacks within block 95' by way of stack select line SSL0 and global select line GSL0. Selection transistor MSD could include a non-volatile transistor.

Referring now to FIG. 8, block 95" includes (n+1) copies of the NAND stack 40 according to a second embodiment of the invention. Each NAND stack 40 is connected at the top to one of (n+1) bit lines, BL0, BL1, through BLn and connected on the bottom to the common source line CSL. Further, the entire block 95" resides within a common well connected to $V_{pw}$. The NAND stack 40 is composed of a number of non-volatile transistors 10 as described above for FIG. 1. Typically, the number of transistors 10 equals a power of two when used to store binary data, and in FIG. 8 sixteen transistors, labeled MC0, MC1, through MC15, are shown as another example embodiment. The gates of transistors MC0, MC1, through MC15 are connected in common with gates of adjacent NAND stacks within blocks 95" by way of word lines WL0, WL1, through WL15, respectively.

The NAND stack 40 also includes a selection transistors MSS whose gate is connected in common with adjacent NAND stacks within block 95" by way of the global select line, GSL0. The primary difference between the two NAND stacks 30 and 40 in FIGS. 7 and 8 is that the transistor MSD in FIG. 7 is a depletion device with a threshold near −1.5 v or eliminated from the NAND stack as in FIG. 8. The depletion transistor MSD was chosen or completely eliminated to minimize voltage drops. All the bias methods used in the new device of this invention allow the depletion transistor MSD device to be optional. The transistor MSD device would be used optionally to decrease the capacitance of the bit line, BL.

Referring additionally to FIG. 9, the NAND stack utilizes a read bias scheme, in which, with all negative threshold voltages, gates of unselected memory cells can be placed at $V_{g,on}$ which is at least equal in magnitude to the magnitude of $V_{off}$ plus the maximum program state threshold voltage ($V_{off}+V_{tpmax}$). The selected memory cell can have a gate at the well potential, in this case Vs=ground. A substrate containing the well can be connected to a supply voltage, such as $V_{cc}$. Alternatively, a second well containing the first well can be connected to a supply voltage, such as $V_{cc}$, while the substrate is at the first well potential. For the purpose herein it is assumed that $V_{g,on}=V_{cc}$. With the gate of the selected memory cell at 0 volts and the program and erase threshold voltages all negative, the common reference line, CSL, needs to be above the gate potential to turn off a selected cell that is programmed, while keeping on one that is erased. For example, if a programmed memory cell transistor has a first threshold voltage and an erased memory cell has a second threshold voltage, the common reference line CSL can have a potential with a magnitude that is at least equal to the first threshold voltage during the reading operation. The voltage relative to the well on the common reference line, CSL, necessary to turn off selected programmed memory cells and keep on selected erased memory cells is $V_{off}$ and is defined by $|V_{tpmin}|=<V_{off}<|V_{temax}|$. With the values of $V_{tpmin}=-1.5$ volts and $V_{temax}=-2.0$ volts, the value of $V_{off}$ could be 1.8 volts.

During reading, the transistors MSD and MSS in FIGS. 7 and 8 are rendered conductive by placing $V_{cc}$ on their gates by way of lines SSL0 and GSL0, respectively. Likewise each of the unselected devices are rendered conductive by placing $V_{g,on}$ on their gates by way of their respective word lines. Adequate conductivity between the selected memory cell and the bit line, BL, and common reference line, CSL, connections must exist so that the state of the selected memory cell can be determined. If the selected memory cell is programmed, very little or negligible current flows through the NAND stack and the bit line, BL, voltage initially at $V_{cc}$ will stay at or near $V_{cc}$. When the selected memory cell is erased, current will flow from the bit line, BL, to common reference line, CSL, and the bit line, BL voltage will drop toward $V_{off}$. $V_{tpmax}$ can then be defined to be the amount of negative threshold necessary to ensure adequate conduction through the NAND stack when all unselected memory cells are programmed to $V_{tpmax}$ and the erased selected memory cell is of minimal conductance at $V_{temax}$.

More specifically, when reading the state of transistor MC1, word line, WL1, is placed at the well potential, in this case $V_s$=ground, while all other word lines are at $V_{g,on}$, in this case chosen to be $V_{cc}$, rendering them conductive. A substrate containing the well can be connected to a supply voltage, such as $V_{cc}$. Alternatively, a second well containing the first well can be connected to a supply voltage, such as $V_{cc}$, while the substrate is at the first well potential. Further, common reference line, CSL, is at $V_{off}=1.8$ volts and the bit line potential on BL0 is placed at $V_{cc}$. If memory transistor MC1 is erased with a depletion threshold voltage of magnitude greater than $V_{off}$, memory transistor MC1 will be conductive, allowing current flow through and NAND stack and the potential of the bit line, BL, will fall from $V_{cc}$ toward $V_{off}$. If memory transistor MC1 is programmed with a depletion threshold voltage of magnitude less than $V_{off}$, memory transistor MC1 will be non-conductive impeding current flow through the NAND stack and the potential of the bit line, BL, will remain equal or nearly equal to $V_{cc}$. The state of the selected cell can be determined by sensing the voltage on the bit line, BL, using conventional sensing means. It is now apparent that the device according to the invention performs a read mode operation with substantially lower voltages.

With respect to read disturbs in unselected devices, during reading, the channel region of unselected memory cells in the NAND stack will be close to the voltage of the common reference line, CSL, of $V_{off}$ under worst case conditions, rather than at ground as in the conventional approach. Further, the gate voltage value of $V_{g,on}$ will be no greater than $V_{cc}$ in the example given above, rather than boosted above $V_{cc}$ in contrast to that of a conventional device. Thus, the gate to channel region voltage in the device of the invention would be $V_{cc}-V_{off}$, rather than greater than $V_{cc}$. Using the specific conditions discussed above where $V_{cc}=3.3$ volts and $V_{off}=1.8$ volts, the gate to source voltage of this invention will be 1.5 volts. This gate to source voltage will produce significantly less disturb than the gate to source voltage of 4.5 volts used in the conventional device. Even if the conventional device used only $V_{cc}=3.3$ volts on the unselected devices, the gate to source voltage would still be over two times greater than that used by the device of this invention. It is now also apparent that the read mode of the device of the invention uses less gate to source voltage on unselected devices, producing substantially less read disturb.

The read bias scheme also works with a deselection method, where all the gates of the memory cells and the select transistor in the NAND stack are brought to the well potential. With this deselection method, when the NAND stack is selected, fifteen word lines, WLs, and the signals on lines GSL and SSL are all driven to $V_{cc}$. As noted earlier, the fifteen word lines, WLs, with the lines GSL and SSL could represent tens and possibly hundreds of picofarads of loading. Though the problem of boosting above $V_{cc}$ does not occur with this read bias scheme, it will be appreciated that driving all that loading could be a problem.

According to one method of deselection, all word lines, WLs, in the NAND stack are deselected high with only the signals on lines GSL and SSL being low to cut-off the current path from the bit line, BL, to the common reference line, CSL, since all word lines, WLs, are high on memory cells with negative thresholds. A selected word line, WL, in this case will be brought to ground while the lines GSL and SSL are brought high to activate the NAND stack.

The method chosen to erase memory cells in the NAND stack enables single word lines, WLs, to be erased. This is done to have smaller sector sizes and the flexibility to erase and program single word lines, WLs if "refreshing" of non-volatile states is necessary. The idea of "refreshing" will be discussed later. FIG. 9 shows the biasing in terms of defined variables for erasing as well as programming, and all biasing is valid for the NAND stack with or without the transistor device MSD.

To erase a single row, the selected row is pumped to a negative potential, $V_{nege}$, while the p-well (bulk) is placed at $V_{cc}$. The p-well is never brought above $V_{cc}$ so that either a single p-well in an n-type substrate or a p-well nested within a n-well on a p-type substrate can be used with this invention. To erase inhibit, word lines, WLs, which are not selected are also brought to the same $V_{cc}$ potential as the p-well. The high negative potential on selected word lines, WLs, causes holes to be accumulated in the selected transistor channel regions. The electric field in the selected memory transistors causes the holes to tunnel to the floating gate, FG, which shifts their threshold voltage negatively to the erased state. This erase mode can also be effected on several word lines at once by use of appropriate word line decoding.

With reference additionally now to FIG. 10, in the program mode the selected word line, WL, is placed at $V_{cc}$, and then the p-well (bulk) is pumped to a negative potential $V_{negpw}$. At the same time the p-well is being pumped, the bit line, BL, associated with the memory cell to be programmed is pumped to $V_{negp}$. The value of $V_{negpw}$ is preferably less than or equal to the value of $V_{negp}$. The difference in $V_{neqpw}$ and $V_{negp}$ is used to back bias the field device between adjacent NAND stacks in a row to increase the field breakdown characteristics. The high positive gate to channel region potential in selected memory transistors inverts the channel region with electrons and the electric field causes the electrons to tunnel to the floating gate, FG, shifting the threshold voltage positively to the programmed state. To inhibit programming of memory cells with its gate at $V_{cc}$, the bit lines, BLs, associated with memory cells to be inhibited are lowered to an inhibit voltage, $V_{inh}$, at the same time the p-well is lowered. For most technologies, $V_{negpw}$ and $V_{negp}$ are below 0 volts, and $V_{inh}$ is usually about halfway between $V_{cc}$ and $V_{negp}$. All deselected word lines, WLs, are lowered to $V_{negpw}$ to stop programming on deselected word lines, WLs.

Referring now to the schematic representation in FIG. 11, another preferred embodiment of the invention utilizes a SONOS (poly-silicon oxide silicon-nitride ooxid silicon) memory transistor 11. The drain (D), gate (G), source (S) and bulk (B) contacts as well as the oxide-nitride-oxide layer (ONO) are labeled in the drawing. Current flows in a channel region between the drain and source when the drain and source are at different potentials, and under direct control of the potential placed on the gate relative to the source and bulk whose potentials need not be equal. The SONOS technology stores charge in traps in the silicon nitride layer and/or silicon oxynitride layer rather in a floating gate. To erase a memory cell, a large negative gate to bulk potential is formed that accumulates the channel region with holes. These holes can tunnel by the Fowler-Nordheim effect to the silicon nitride because of the large electric fields that result from the large gate to bulk potential. Holes in the silicon nitride will erase the memory cell to shift the threshold in a negative direction to provides a logic "0" stored state. To program the memory cell, a large positive gate to bulk potential is formed that inverts the channel region with electrons. As with holes, the electrons can tunnel by the Fowler-Nordheim effect to the silicon nitride. The threshold voltage of the memory transistor shifts in the positive direction to provide a logic "1" state.

Figure 12:
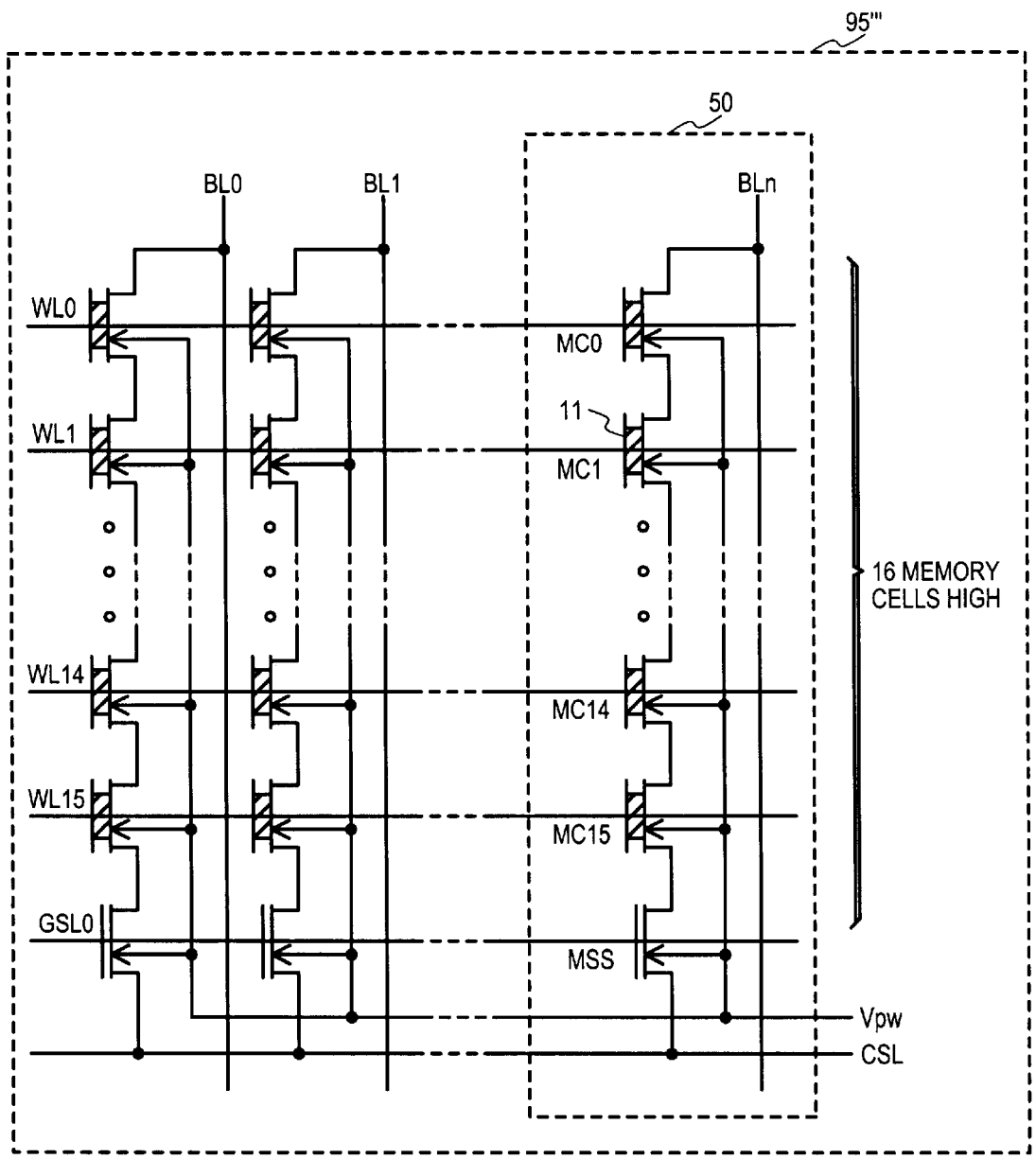
FIG. 12 is a schematic showing an internal circuit arrangement of a NAND configured non-volatile memory according to another preferred embodiment of the invention using a silicon nitride dielectric charge accumulation layer.

As shown in FIG. 12, another preferred embodiment of the invention shown in FIG. 6 uses a NAND stack 50 with SONOS devices 11 without a select transistor, MSD. A detailed schematic of block 95''' includes (n+1) copies of the NAND stack 50. Each NAND stack 50 is connected at the top to one of (n+1) bit lines, BL0, BL1, through BLn and connected on the bottom to the common source line, CSL. Further, the entire block 95''' resides within a common well connected to $V_{pw}$.

The NAND stack 50 includes a number of non-volatile transistors 11 as described above with regard to FIG. 11. Typically, the number of transistors 11 equals a power of two when used to store binary data, and in FIG. 12 sixteen transistors, labeled MC0, MC1, through MC15, are shown as an example embodiment. The gates of transistors MC0, MC1, through MC15 are connected with gates of adjacent NAND stacks within block 95''' by way of word lines WL0, WL1, through WL15, respectively.

The NAND stack 50 also includes a selection transistor MSS, whose gate is connected in common with adjacent NAND stacks within block 95''' by the global select line GSL0. The primary difference between the two NAND stacks 40 and 50 in FIG. 8 and FIG. 12 is the choice of memory transistor, 10 or 11 respectively. The transistor MSD shown in FIG. 7 could be used optionally in the NAND stack using memory transistor 11 to decrease the capacitance of the bit line, BL. In this case the transistor MSD could be either a conventional field effect transistor or a SONOS field effect transistor.

Referring additionally now to FIG. 13, biases according to this invention are shown using with $V_{cc}$=3.0 volts for a floating gate, FG, embodiment and for a SONOS embodiment. The floating gate, FG, embodiment is included for comparison, contrasting the significantly lower erase and program voltages of the SONOS embodiment.

With all negative threshold voltages, gates of unselected SONOS memory cells can be placed at $V_{g,on}$, which is at least equal in magnitude to the magnitude of $V_{off}$ plus the maximum program state threshold voltage ($V_{off}+V_{tpmax}$). The selected SONOS memory cell whose gate is at the well potential, in this case $V_s$=ground. A substrate containing the well can be connected to a supply voltage, such as $V_{cc}$. Alternatively, a second well containing the first well can be connected to a supply voltage, such as $V_{cc}$, while the substrate is at the first well potential. It is assumed that $V_{g,on}=V_{cc}$. With the gate of the selected memory cell at 0 volts and the program and erase threshold voltage all negative, the common reference line, CSL, needs to be above the gate potential to turn off a selected cell that is programmed while keeping on one that is erased. The voltage relative to the well on the common reference line, CSL, necessary to turn off selected programmed memory cells and keep on selected erased memory cells is $V_{off}$ and is defined by $|V_{tpmin}|<V_{off}<|V_{temax}|$. With the values of $V_{tpmin}$=-1.5 volts and $V_{temax}$=-2.0 volts, the value of $V_{off}$ could be 1.8 volts.

During reading, the transistor MSS in FIG. 12 is rendered conductive by placing $V_{cc}$ on its gate by way of line GSL0. Likewise each of the unselected devices are rendered conductive by placing $V_{g,on}$ on their gates by way of their respective word lines. Adequate conductivity between the selected memory cell and the bit line, BL, and the common reference line, CSL, exist so that the state of the selected memory cell can be determined. If the selected memory cell is programmed, very little or negligible current flows through the NAND stack and the voltage of the bit line, BL, initially at $V_{cc}$ will stay at or near $V_{cc}$. When the selected memory cell is erased, current will flow from the bit line, BL, to the common reference line, CSL, and the voltage of the bit line, BL, will drop toward $V_{off}$. $V_{tpmax}$ can then be defined to be the amount of negative threshold necessary to ensure adequate conduction through the NAND stack when all unselected memory cells are programmed to $V_{tpmax}$ and the erased selected memory cell is of minimal conductance at $V_{temax}$.

More specifically, when reading the state of SONOS transistor MC1, the word line WL1 is placed at the well potential, in this case $V_s$=ground, while all other word lines are at $V_{g,on}$, in this case chosen to be $V_{cc}$, rendering them conductive. Further, the common reference line, CSL, is at $V_{off}$=1.8 volts and the bit line potential on line BL0 is placed at $V_{cc}$. If memory transistor MC1 is erased with a depletion threshold voltage of magnitude greater than $V_{off}$, the memory transistor MC1 will be conductive, allowing current flow through the NAND stack and the potential of the bit line, BL, will fall from $V_{cc}$ toward $V_{off}$. If memory transistor MC1 is programmed with a depletion threshold voltage of magnitude less than $V_{off}$, the memory transistor MC1 will be non-conductive, impeding current flow through the NAND stack and the potential of the bit line, BL, will remain equal or nearly equal to $V_{cc}$. The state of the selected cell can be determined by sensing the voltage on the bit line, BL, using conventional sensing means.

The method to erase SONOS memory cells in the NAND stack enables single word lines, WLs, to be erased. This is done to have smaller sector sizes and the flexibility to erase and program single word lines, WLs, if "refreshing" of non-volatile states is necessary, as discussed below.

FIG. 13 shows the biasing in terms of defined variables for erasing, as well as programming. All biasing is valid for the NAND stack with or without the transistor, MSD. To erase a single row, the selected row is pumped to a negative potential, $V_{nege}$, while the p-well (bulk) is placed at $V_{cc}$. The p-well is never brought above $V_{cc}$ so that either a single p-well in an n-type substrate or a p-well nested within a n-well on a p-type substrate can be used with this invention.

To erase inhibit word lines which are not selected, deselected word lines are also brought to the same $V_{cc}$ potential as the p-well. The high negative potential on selected word lines accumulates holes in the selected transistor channel regions. The electric field in the selected memory transistors causes the holes to tunnel to traps in the silicon nitride, which shifts their threshold voltage negatively to the erased state. This erase mode can also be affected on several word lines at once by use of appropriate word line decoding.

As shown in FIG. 13 and FIG. 10, in the program mode the selected word line, WL, is placed at $V_{cc}$ and then the p-well (bulk) is pumped to a negative potential, $V_{negpw}$. At the same time the p-well is being pumped, the bit line, BL, associated with the SONOS memory cell to be programmed is pumped to $V_{negp}$. The value of $V_{negpw}$ is preferably less than or equal to the value of $V_{negp}$. The difference in $V_{negpw}$ and $V_{negp}$ is used to back bias the field device between adjacent NAND stacks in a row to increase the field breakdown characteristics. The high positive gate to channel region potential in selected SONOS memory transistors inverts the channel region with electrons and the electric field causes the electrons to tunnel to the traps in the silicon nitride, shifting the threshold voltage positively to the programmed state.

To inhibit programming of SONOS memory cells with its gate at $V_{cc}$, the bit lines associated with SONOS memory cells to be inhibited are lowered to an inhibit voltage, $V_{inh}$ at the same time the p-well is lowered. For most technologies, $V_{negpw}$ and $V_{negp}$ are below 0 volts, and $V_{inh}$ is usually about halfway between $V_{cc}$ and $V_{negp}$. All deselected word lines, WLs, are lowered to $V_{negpw}$ to stop programming on deselected word lines.

Specifically, in writing a programmed state in memory transistor MC1 on bit line BL0 and memory transistor MC1 on another bit line, such as BLn, while inhibiting a write on memory transistor MC1 on bit line BL1, word line WL1 is raised to $V_{cc}$=3.0, volts while all other nodes are held at $V_s$=ground. Then the p-well (bulk) is lowered to $V_{negpw}$=−8.0 volts. Simultaneously bit lines BL0 and BLn follow the p-well to $V_{negp}$=−7.0 volts, but bit line BL1 follows the p-well to only $V_{inh}$=−2.0 volts. The unselected word lines, WL0, WL2, WL3 through WL15 are driven to $V_{negp}$=−7.0 volts. When the unselected word lines fall to $V_{negp}$, the channel potential in the memory transistor MC1 on bit lines BL0 and BLn will be very near $V_{negp}$, since all of the transistors in the NAND stack will be inverted and conductive.

A high field is thus created across the ONO dielectric in the selected memory transistor MC1 on bit lines BL0 and BLn which causes electrons to tunnel into the traps in the silicon nitride, shifting the threshold voltage positively to program state. On the other hand in the memory transistor MC1 on the bit line BL1, once the unselected gates fall a threshold voltage below $V_{inh}$, the channel will become isolated and the channel potential will remain near $V_{inh}$ minus the magnitude of the threshold voltage of the unselected transistors. If the isolated channel potential changes during inhibit mode due to stray unwanted leakage, the channel can be returned to near $V_{inh}$ by periodically pulsing the unselected gates momentarily back above $V_{inh}$. The unselected transistors in this case have a high back gate bias which shifts the threshold voltage positively, affecting the selection of $V_{inh}$.

Regardless of the data state, the potential difference between the gate and channel of the unselected devices is either zero or very near zero, virtually eliminating disturbs. This benefit results from using all negative, or depletion, threshold voltages for both the program and erased states, thus eliminating the need for gate bias to overcome the program state threshold voltage. It is therefore apparent that the present invention virtually eliminates disturbs in the program mode by eliminating the need for gate bias on unselected devices.

SONOS memory cells typically have well behaved program and erase characteristics. Program and erase speeds are highly predictable with the total program or erase threshold distribution typically spanning not more than 300 mV (millivolts). There is also a highly predictable natural charge loss over time from the silicon nitride film, and with this charge loss, program and erase threshold voltages decay predictably over time to the natural (no charge) threshold voltage.

Figure 4:
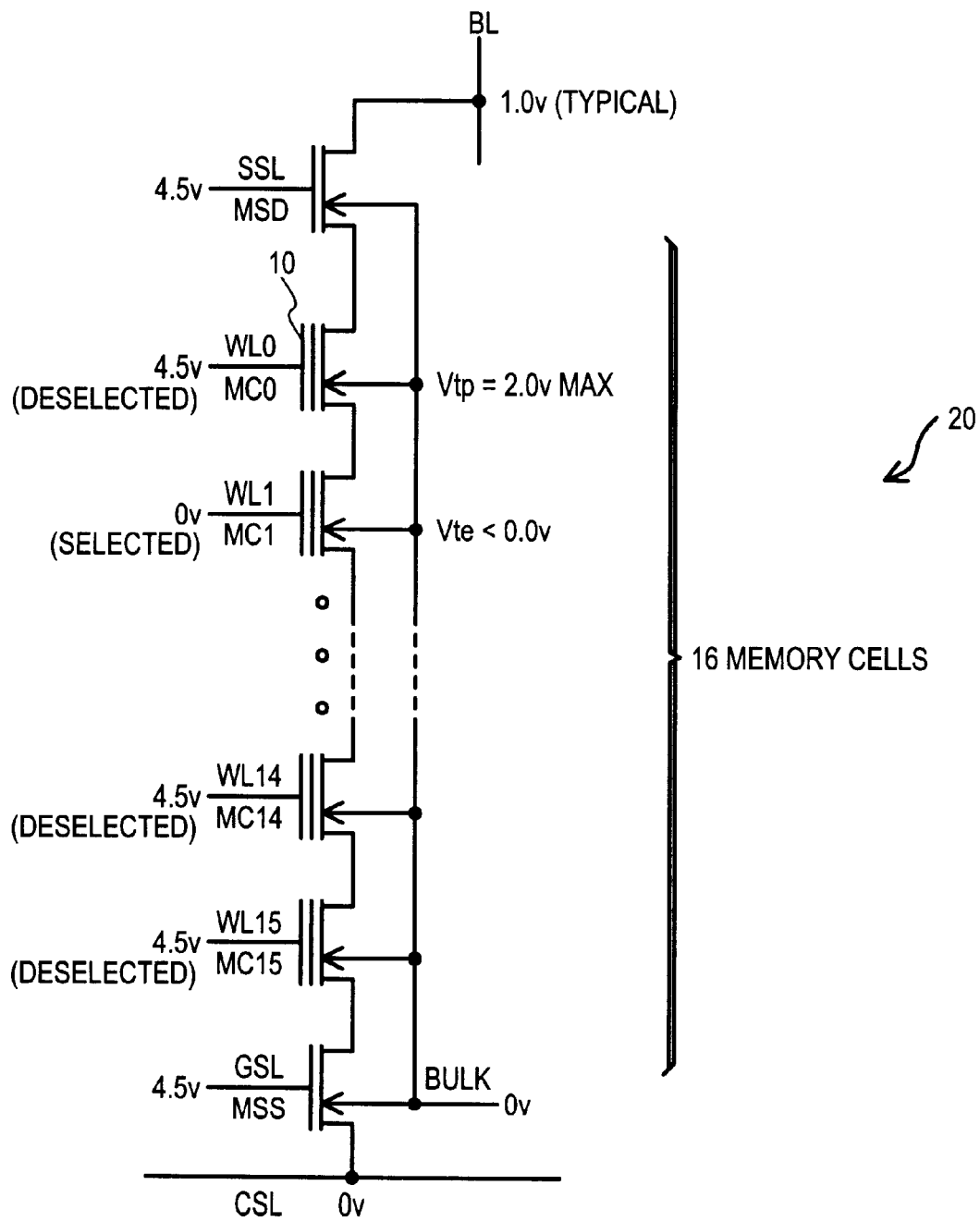
FIG. 4 illustrates the biases applied to a NAND memory stack under the worst case gate voltage disturb condition during a read operation according to the prior art.

FIG. 4 illustrates this threshold voltage decay versus time for an example worst case SONOS cell in both the program and erase state. The $V_{tpmax}$, $V_{tpmin}$ and $V_{temax}$ shows the worst cast threshold voltage levels that cells can have and still work with the new read bias scheme. Worst case conditions typically occur when the operating temperature is at its highest since the charge decay is a thermally activated process.

Typically silicon nitride based dielectric storage technologies attain retention at 10 years with usually 100K erase/program cycles at temperatures as high as 80° C. If product were expected to operate well above 80° C. or with significantly greater erase/program cycles, the charge would decay faster. The result is that retention would probably be less than the industry standard of 10 years if no precautions are taken.

Figure 15:
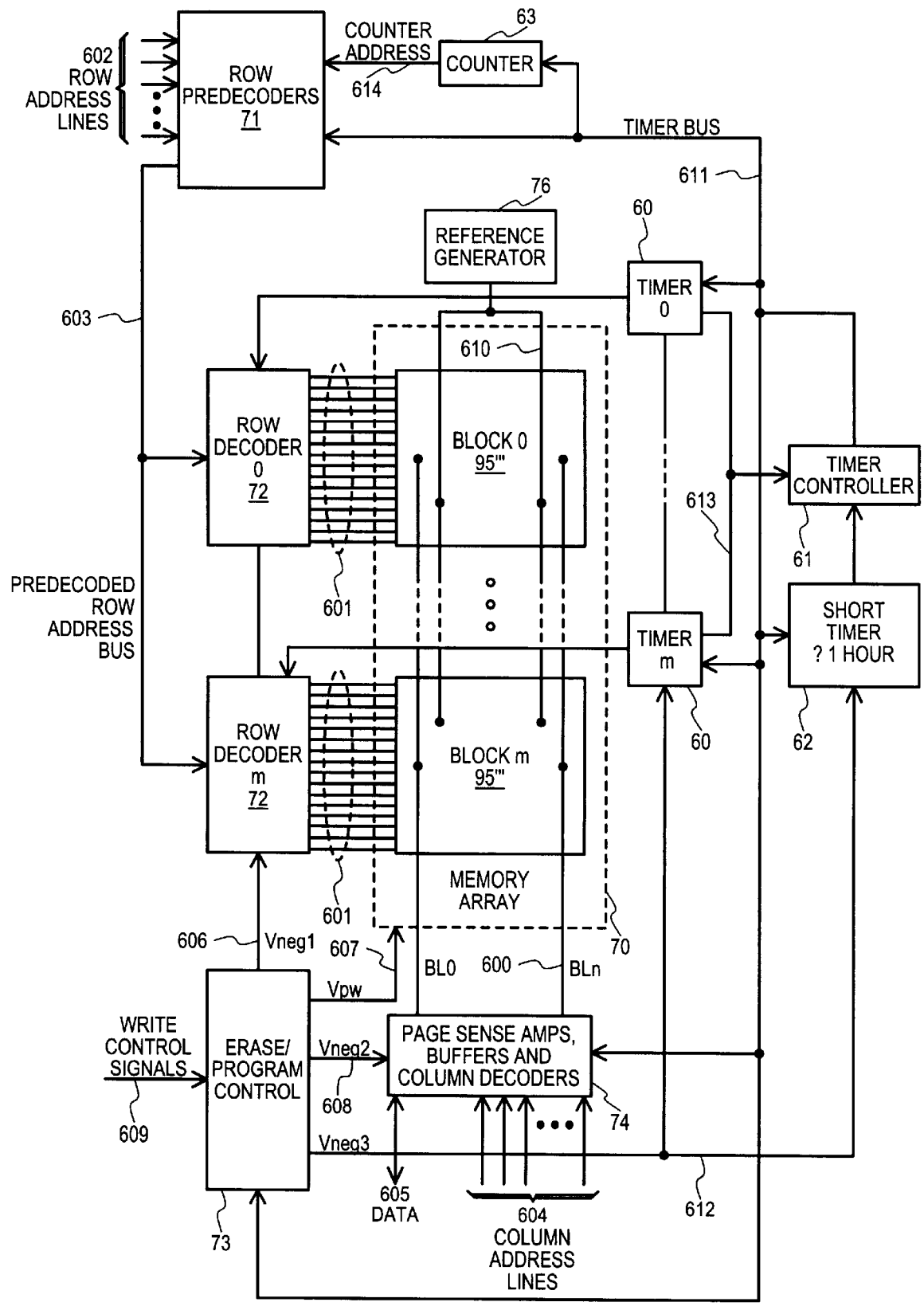
FIG. 15 schematically shows the overall circuit arrangement of the NAND stack cell memory circuit according to another preferred embodiment of the present invention.

Referring now to FIG. 15, a fourth preferred embodiment uses a SONOS based timer which takes advantage of the predictable threshold voltage behavior. Such a timer element is disclosed in U.S. provisional patent No. 60/007,062, which is incorporated herein by reference. The SONOS based timer can be used to time-out prior to SONOS memory cell failure indicating the impending failure of SONOS memory cells in the blocks 75.

A non-volatile memory device according to the fourth preferred embodiment of the invention has a memory array 70 which includes at least two blocks 75, each block being at least one, and preferably more than one NAND stack units in height. The NAND stacks are not shown within the blocks 95''' in FIG. 15, but are shown in greater detail in FIG. 12. Associated with each block 95''' are the row decoders 72 that drive lines 601 across the width of the blocks 75, including word line WL, line GSL, and an optional line SSL. The use of these lines 601 within block 95''' is shown in greater detail in FIG. 12. The blocks 95''' are linked together by the bit lines 600 that also go to the page sense amps, buffers and column decoders 74. Further, blocks 95''' are linked together in common by the common reference line CSL 610, whose voltage is generated and controlled by a reference generator 76. reference generator 76 is required since the voltage on the common reference line CSL is not equal to ground potential during read modes as described above.

Predecoded row address selection information is supplied to row decoders 72 by the row predecoder 71 by way of the predecoded row address bus 603. The row address lines 602 supply row input address information to row procedures 71, and, likewise, column address lines 604 provide column input address information to column decoders, included in the page sense amps, buffers and column decoders 74.

An erase/program control unit 73 is included which is controlled by write control lines 609 to supply Vneg1 606 to the row decoders 72, Vneg2 608 to the page sense amps, buffers and column decoders unit 74, and $V_{pw}$ 607 to the memory array 70. Data input and output is performed by way of data line 605.

The erase/program control unit 73 also supplies Vneg3 612 to the SONOS based block timers 60 and the short timer 62 to reset the SONOS element within these timers. The block timers 60 output to the row decoders 72 to signal that a refresh operation on its associated block is enabled. Also block timers 60 output to a wired-or line, refresh 613, that signal to the timer controller 61 to refresh the block that timed-out if the short timer 62 has also timed-out. The timer controller 61 controls the refresh operation on all parts of the memory through the timer bus 611. The timer bus 611 switches the row predecoders 71 to look at counter 63 address on line 614 instead of row address 602 and tells the counter 63 to reset on first refresh of word line, WL, and to count to the next word line for subsequent word line refreshes. Also, the timer bus 611 inhibits other block timers 60, if one has already timed-out. Timer controller 61 controls the overall activity of monitoring the timer 60 and short timer 62 as well as controlling a refresh mode to re-write data stored in block 75. Counter 63, row predecoders 71, the page sense amps, buffers and column decoders unit 74 and erase/program control 73 are controlled by timer controller 61 by way of the timer bus 611 to generate row address sequences, row selections and biases during refresh mode.

Upon the time-out event in timer 60 a refresh cycle can be initiated to "refresh" the memory cells in block 75. Ideally, only a single timer would be necessary and the entire memory would go through refresh cycles upon time-out. In a SONOS technology, the erase/program cycle takes about 10 milliseconds to complete and with a large array with possibly 8K word lines or more, 80 seconds would be necessary to refresh the whole array. This amount of time could be extremely taxing on a system if done all at one time. A better solution would be to dedicate a timer to each block 95''' or groups of block 95''' containing 16, 32, 48, 64 or more word lines corresponding to 1, 2, 3, 4 or more NAND stack units. FIG. 15, therefore, shows one timer per block and a timer controller that is designed to refresh only one block at a time rather than the entire memory device.

More specifically, using both FIG. 15 and FIG. 12, upon time-out, the block timer 0 sends a signal to timer controller 61 indicating that the threshold voltage in cells within block 0 are near their end of life values. Timer controller then executes the refresh cycle on each word line, WL, in block 0. A read mode is initiated by precharging bit lines and activating the page sense amps, buffers and column decoders unit 74 to read data from a selected row. Counter 63 is initialized with the first row address within block 0 and then row predecoder 71 and row decoder 0 establish word line biases to a read all of the memory cells on word line WL0. The erase/program control 73 is then activated to first erase word line WL0 within block 0 and then to program the data stored in the sense amplifier back into the memory cells. Thus the data which was read from the cells on word line WL0 is refreshed to beginning if life threshold voltages.

The timer controller 61 then continues this refresh cycle for the remaining word lines, WL1, WL2 through WL15, each time incrementing the counter 63 so that the row decoder 0 selects the proper row. Once the last row has been refreshed, the SONOS timer element in timer 0 is reset by using Vneg3. With 16 word lines in a block, the total time to refresh the memory cells on each word line would be 160 ms, which is much more system and user friendly than 80 seconds of refresh cycles.

How often refresh cycles are required will depend on the rate at which charge decays from the silicon nitride. The block timer 60 is designed such that its SONOS timing element experiences the same conditions as the memory cells within its associated block 75. Under nominal conditions Timer 60 may take tens of years to time-out. However, under more severe conditions such as high temperature, high endurance and/or high disturbs, timer 60 could time-out as often as every month. Here the probability of simultaneous time-out among the various timer 60 is high, especially upon power-up when the device is unpowered for extended periods of time. In the worst case, the entire device could require refresh upon power-up, delaying useful operation for minutes. To prevent this long continuous refresh a short timer 62 is provided which must time-out between the refresh of each block 60. Thus after a block 60 is refreshed, the timer controller 61 resets the SONOS timing element in short timer 62 using Vneg3. Thereafter, the timer controller 61 is precluded from refreshing a subsequent block 95''' until short timer 62 times out again. The time-out period of the short timer 62 will be minutes to hours, depending on the application.

Although the invention has been described and illustrated with a certain degree of particularly, it is understood that the present disclosure has been made only by way of example, and that numerous changes in the combination and arrangement of parts can be resorted to by those skilled in the art without departing from the spirit and scope of the invention, as hereinafter claimed.

What is claimed is:

1. A non-volatile semiconductor device comprising:
   a semiconductor substrate;
   data transmission bit lines arranged on said substrate;

a memory cell block including a plurality of memory stack units, each connected on a first end to one of said bit lines and on a second end to a common reference node, each of said memory stacks comprising series connected addressable memory transistors and at least one series connected selection transistor on said second end to selectively connect said memory stack unit to a reference potential node, each said memory transistors having a source node, a drain node, a gate, and a charge storage layer that has programmable memory states that produce a first threshold voltage of an absolute magnitude less than an absolute magnitude of a supply voltage when the memory transistor is programmed and a second threshold voltage of absolute magnitude greater than the absolute magnitude of the first threshold voltage when the memory transistor is erased;

biasing circuitry for applying selected read biasing voltages to said memory stack units including a reference voltage of magnitude no greater than the magnitude of said supply voltage and greater than the magnitude of said first threshold voltage, the reference voltage being applied to said reference potential node, and a voltage greater than said reference voltage applied to said first end of said memory stack;

and sensing circuitry for sensing a current generated at said first end of said memory stack in accordance with the programmable state of said charge storage layer of said addressable memory transistor.

2. The device of claim 1 wherein said memory transistors comprise floating gate tunneling metal insulator semiconductor field effect transistors.

3. The device of claim 1 wherein said memory transistors comprise silicon oxide nitride oxide silicon (SONOS) tunneling metal insulator semiconductor field effect transistors.

4. The device of claim 1 wherein said memory stack unit further comprises at least a second selection transistors connected in series at said first end of said memory stack and selectively rendered conductive for electrically connecting said selected memory stack to a corresponding bit line associated therewith.

5. The device of claim 4 wherein said memory transistors and said second selection transistor comprise silicon oxide nitride oxide silicon (SONOS) tunneling metal insulator semiconductor field effect transistors.

6. The device of claim 1 wherein said substrate has a first conductivity type and said source and drain nodes are semiconductor regions of a second conductivity type.

7. The device of claim 1 wherein said substrate has a first conductivity type and said source and drain nodes are semiconductor regions of a first conductivity type; and wherein said memory cell block further comprises a first well region of a second conductivity type formed in said substrate as to surround said memory stack units.

8. The device of claim 7 wherein means is provided to connect said substrate to said supply voltage and to connect said first well to a supply reference voltage during a read operation.

9. The device of claim 1 wherein said substrate has a first conductivity type and said source and drain nodes are semiconductor regions of a second conductivity type; and wherein said memory cell block further comprises a first well region of a first conductivity type formed in said substrate as to surround said memory stack units and wherein said device further comprises an additional second well region of the second conductivity type formed in said substrate as to surround at least said first well region.

10. The device of claim 9 wherein means is provided to connect said substrate to a supply reference voltage and to connect said second well to said supply voltage and to additionally connect said first well to said supply reference voltage during a read operation.

11. The device of claim 1 wherein said read biasing circuitry provides means to bias gates of selected memory devices to a supply reference potential during a read operation.

12. The device of claim 1 wherein said read biasing circuitry comprises means to bias gates of unselected memory devices within a selected memory stack to a voltage of magnitude at least equal to the magnitude of the sum of said reference voltage supplied to said second end of said memory stack and the value of said first threshold voltage.

13. The device of claim 1 wherein the first threshold voltage and the second threshold voltage are depletion threshold voltages.

* * * * *